US008730728B2

(12) United States Patent
Kang (10) Patent No.: US 8,730,728 B2
(45) Date of Patent: May 20, 2014

(54) EEPROM CELL WITH TRANSFER GATE

(75) Inventor: Jin-Yeong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 58 days.

(21) Appl. No.: 13/614,282

(22) Filed: Sep. 13, 2012

(65) Prior Publication Data

US 2013/0286740 A1    Oct. 31, 2013

(30) Foreign Application Priority Data

Apr. 26, 2012    (KR) .......................... 10-2012-0044066

(51) Int. Cl.
| G11C 11/34 | (2006.01) |
| G11C 16/10 | (2006.01) |
| G11C 11/56 | (2006.01) |

(52) U.S. Cl.
CPC ............ *G11C 16/10* (2013.01); *G11C 11/5628* (2013.01)
USPC .................................. 365/185.11; 365/185.24

(58) Field of Classification Search
CPC ............................. G11C 16/10; G11C 11/5628
USPC ........................................ 365/185.11, 185.24
See application file for complete search history.

(56) References Cited

U.S. PATENT DOCUMENTS

| 5,430,675 A | 7/1995 | Yajima et al. |
| 5,457,652 A | 10/1995 | Brahmbhatt |
| 5,761,126 A | 6/1998 | Chi et al. |
| 7,292,475 B2 | 11/2007 | Kodaira et al. |
| 7,700,994 B2 | 4/2010 | Roizin et al. |
| 2006/0018161 A1* | 1/2006 | Chen et al. ................ 365/185.28 |
| 2007/0189075 A1* | 8/2007 | Ausserlechner et al. 365/185.23 |
| 2009/0052245 A1* | 2/2009 | Li et al. ..................... 365/185.05 |
| 2009/0168540 A1* | 7/2009 | Nguyen et al. ........... 365/185.21 |
| 2013/0099299 A1* | 4/2013 | Yamazaki et al. ............ 257/296 |

FOREIGN PATENT DOCUMENTS

| KR | 1999-0082845 | 11/1999 |
| KR | 1020090071920 | 7/2009 |

OTHER PUBLICATIONS

Aritome, Seiichi et al., "Reliability Issues of Flash Memory Cells," Proceedings of the IEEE, vol. 81(5):776-788 (1993).
Roizin, Y. et al., "C-Flash: An Ultra-Low Power Single Poly Logic NVM," International Conference on Memory Technology and Design, Non-Volatile Semicondutor Memory Workshop NVSMW/ICMTD, pp. 90-92 (2008).

(Continued)

*Primary Examiner* — Michael Tran
(74) *Attorney, Agent, or Firm* — Nelson, Mullins, Riley & Scarborough LLP (57) ABSTRACT

An EEPROM cell including a transfer gate that can suppress a data disturbance phenomenon of the EEPROM cell is provided. The EEPROM cell includes: an inverter; a control plate; a tunneling plate; a data output metal oxide semiconductor field effect transistor (MOSFET) that is connected to the inverter; a floating plate that is connected to the inverter; a tunneling capacitor area that is formed between the floating plate and the tunneling plate; and a transfer gate that is connected to the tunneling plate. As the transfer gate is added between a bit line and the tunneling plate of the EEPROM cell, in a standby (or unselected) operation of the EEPROM cell, the tunneling plate is floated.

11 Claims, 5 Drawing Sheets

(56) References Cited

OTHER PUBLICATIONS

Wang, Bin et al., "Opportunities and Challenges in Multi-times-programmable Floating-Gate Logic Non-Volatile Memories," International Conference on Memory Technology and Design, Non-Volatile Semiconductor Memory Workshop, NVSMW/ICMTD, pp. 22-25 (2008).

Wang, Bin et al., "Scaling Tunneling Oxide to 50A in Floating-Gate Logic NVM at 65nm and Beyond," IEEE International Integrated Reliability Workshop Final Report, pp. 48-51 (2007).

* cited by examiner

FIG. 5

EEPROM CELL WITH TRANSFER GATE

CROSS-REFERENCE TO RELATED APPLICATION

This application claims priority to and the benefit of Korean Patent Application No. 10-2012-0044066 filed in the Korean Intellectual Property Office on Apr. 26, 2012, the entire contents of which are incorporated herein by reference.

BACKGROUND OF THE INVENTION (a) Field of the Invention

The present invention relates to an EEPROM cell. More particularly, the present invention relates to an EEPROM cell into which a transfer gate is inserted to reduce instability of data that is stored at the EEPROM cell during a standby operation thereof.

(b) Description of the Related Art

An electrically erasable programmable read-only memory (EEPROM) is a kind of a programmable read-only memory (PROM), and is a ROM that improves a drawback of an erasable programmable read-only memory (EPROM) that can erase contents when radiating ultraviolet rays. The EEPROM erases internal data by applying an electrical signal to a pin of a chip.

Such an EEPROM is a non-volatile storage element and is currently used for a system-on-chip (SoC) or a radio frequency identification (RFID) tag. In this case, the EEPROM has various capacities from tens of bytes to several gigabytes according to usage of a product, and particularly, when the EEPROM is used for RFID, the EEPROM should have good adherence and thus the EEPROM needs a high density and super down-sizing of a chip, and should also have a good economical efficiency.

In order to achieve the above purposes, the EEPROM needs to operate only as a complementary metal-oxide semiconductor (hereinafter, referred to as 'CMOS') element. When the CMOS element is not used in the EEPROM, an array of the EEPROM and a design rule of a related circuit increase, a control circuit of a chip should be manually designed, and design contents should be constructed with hard intellectual property (IP), and even if a design is changed a little, there is a problem that recycling of the EEPROM is impossible.

However, in a process at 65 nm or lower, when a CMOS element is used and an array of an existing EEPROM cell is applied, a control operation of an element becomes unstable. However, for stability of a control operation, when an array of the EEPROM cell is newly designed, an outside line is separately added and thus a control operation becomes complicated.

In order to solve a problem in the above process at 65 nm or lower, by forming a tunneling oxide film to a size of 26 Å or lower, a method of reducing a cell area of the EEPROM and simplifying a peripheral control circuit was suggested, but there is a problem that a disturbance phenomenon in which data that has been previously programmed for programming erasing standby time is erased occurs.

SUMMARY OF THE INVENTION

The present invention has been made in an effort to present an EEPROM cell having advantages of reducing instability by protecting data that is stored at the EEPROM cell by preventing a disturbance phenomenon of data for a standby operation of the EEPROM cell.

An exemplary embodiment of the present invention provides an EEPROM cell including a transfer gate that can suppress a data disturbance phenomenon while in a standby operation of the EEPROM cell. The EEPROM cell includes: an inverter; a tunneling plate; a data output metal oxide semiconductor field effect transistor (MOSFET) that is connected to the inverter; a floating plate that is connected to the inverter; a tunneling capacitor area that is formed between the floating plate and the tunneling plate; and a transfer gate that is connected to the tunneling plate, wherein the transfer gate transfers an operation voltage of the EEPROM cell that is applied to a bit line of the EEPROM cell to the tunneling plate.

The inverter may be a CMOS inverter, and a gate of the CMOS inverter may be connected to the floating plate.

The EEPROM cell may further include a control plate that is connected to a word line of the EEPROM cell, and a control capacitor area that is formed between the control plate and the floating plate.

A capacity of a capacitor that is formed in the tunneling capacitor area may be 1%-10% of that of a capacitor that is formed in the control capacitor area.

The transfer gate may include a p-MOSFET and an n-MOSFET, and a drain of the p-MOSFET and a drain of the n-MOSFET may be connected to the tunneling plate, while a source of the p-MOSFET and a source of the n-MOSFET may be connected to a bit line.

The transfer gate may include a p-MOSFET and an n-MOSFET, and a source of the p-MOSFET and a source of the n-MOSFET may be connected to the tunneling plate, while a drain of the p-MOSFET and a drain of the n-MOSFET may be connected to a bit line.

The transfer gate may include an n-type well that is doped with electrons, a p-type well that is doped with holes, and a deep n-type well that separates the p-type well from a p-type substrate of the transfer gate.

A maximum value of a programming or erasing operation voltage of the EEPROM cell may be applied to the n-type well of the transfer gate, a minimum value of a programming or erasing operation voltage of the EEPROM cell may be applied to the p-type well, and the deep n-type well may be grounded.

A gate of the p-MOSFET and a gate of the n-MOSFET may be commonly grounded.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification and claims, unless explicitly described to the contrary, the word "comprise" and variations such as "comprises" or "comprising" will be understood to imply the inclusion of stated elements but not the exclusion of any other elements.

Hereinafter, an EEPROM cell and programming, erasing, standby, and sense operations of the EEPROM cell according to an exemplary embodiment of the present invention will be described in detail with reference to the drawings.

Figure 1:
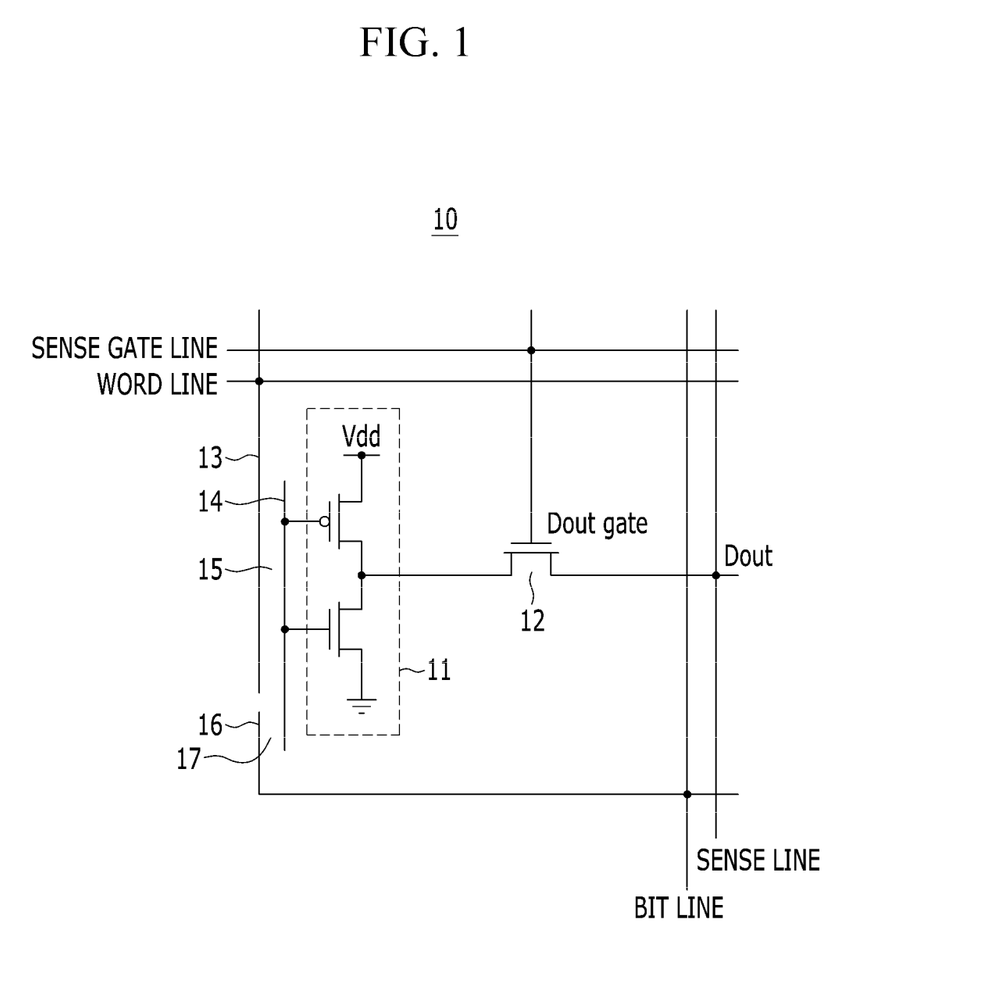
FIG. 1 is a diagram illustrating a conventional EEPROM cell.

FIG. 1 is a diagram illustrating a conventional EEPROM cell.

Referring to FIG. 1, an EEPROM cell 10 that stores data includes a CMOS inverter 11, a data output metal-oxide semiconductor field effect transistor (hereinafter, referred to as a 'MOSFET') 12 that is connected to a drain of the CMOS inverter 11, a control plate 13 that is connected to a word line, a floating plate 14 that is connected to a gate of the CMOS inverter 11, a control capacitor area 15 that is formed between the control plate 13 and the floating plate 14, a tunneling plate 16 that is connected to a bit line, and a tunneling capacitor area 17 that is formed between the floating plate 14 and the tunneling plate 16.

The EEPROM cell 10 performs programming, erasing, standby, and sense operations. As an appropriate voltage is applied to a word line, a bit line, a sensor gate line, and a sensor line, the programming, erasing, standby, and sense operations are performed.

In the EEPROM cell 10, data is programmed in order of "standby→erasing→standby→programming→standby". That is, in order to program data in the EEPROM cell 10, a standby operation is first performed, an erasing operation is performed, a standby operation is again performed, and a programming operation is performed.

In this case, the programming operation or the erasing operation is performed by movement of electrons due to a voltage that is applied to both ends of the tunneling capacitor area 17. That is, by adjusting a voltage difference between both ends of the tunneling capacitor area 17, when a programming operation of the EEPROM cell 10 is performed, electrons are gathered to the floating plate 14, and when an erasing operation of the EEPROM cell 10 is performed, electrons go out of the floating plate 14.

In a standby operation, in order to prevent electrons from moving through the floating plate 14, it is necessary to minimize a voltage difference between both ends of the tunneling capacitor area 17.

However, in a standby operation of the EEPROM cell 10, because a voltage of 0 V may be applied to the bit line and a voltage of −2 V to 2 V may be applied to the word line, a voltage difference that can move electrons may occur at both ends of the tunneling capacitor area 17.

That is, in this case, in a standby operation of the EEPROM cell 10, a voltage difference occurs at both ends of the tunneling capacitor area 17 and thus a disturbance phenomenon of data that is stored at the EEPROM cell 10 may occur. As described above, in a conventional EEPROM cell, in a standby operation, a meaningful voltage difference that may cause a motion of electrons occurred in the tunneling capacitor area 17 and thus a data maintaining time is short for a standby operation of the EEPROM cell 10.

For example, data that is erased in the EEPROM cell 10 may be sustained within about 63 seconds ($2 \times 10^{-6}$ years) in a standby operation, and programmed data may be sustained within about 6300 seconds ($2 \times 10^{-4}$ years) in a standby operation.

Therefore, in order to increase reliability of the EEPROM, technology that suppresses an electric field from occurring by reducing a voltage difference that is applied to both ends of the tunneling capacitor area 17 is requested.

Figure 2:
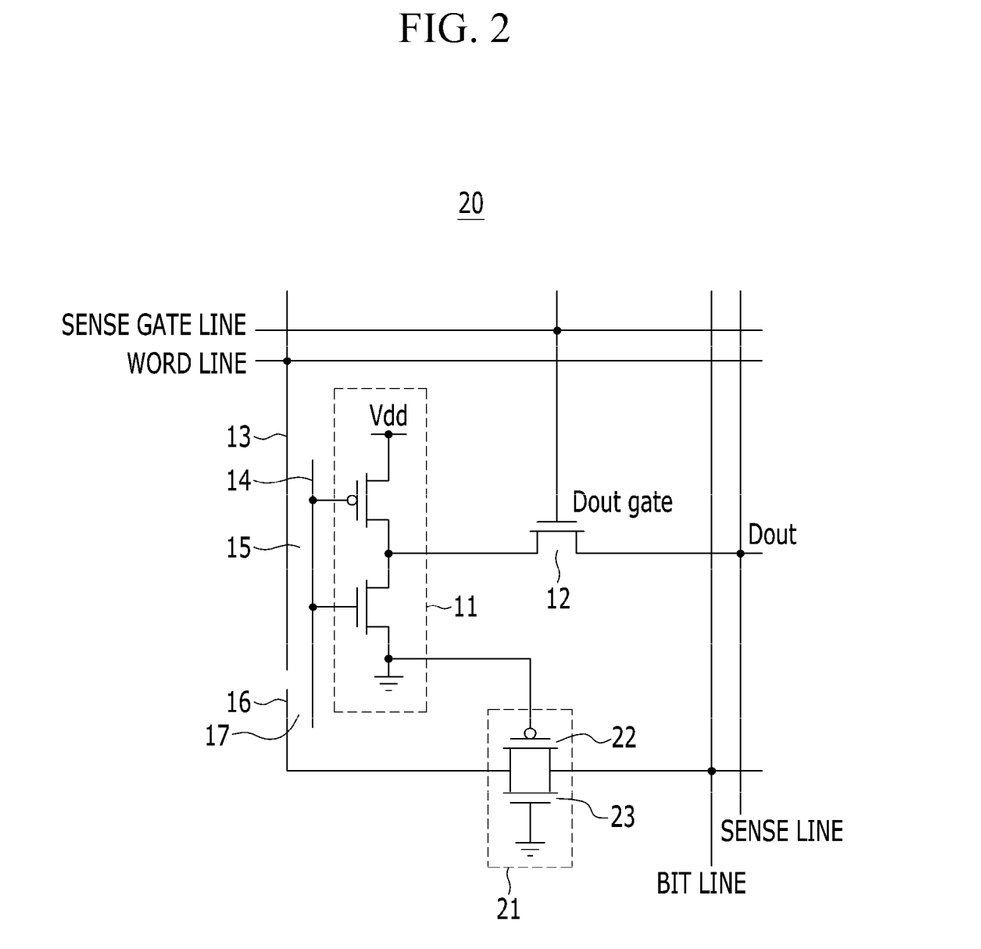
FIG. 2 is a diagram illustrating an EEPROM cell according to an exemplary embodiment of the present invention.

FIG. 2 is a diagram illustrating an EEPROM cell according to an exemplary embodiment of the present invention.

Referring to FIG. 2, an EEPROM cell 20 according to an exemplary embodiment of the present invention includes a CMOS inverter 11, a data output MOSFET 12 that is connected to a drain of the CMOS inverter 11, a control plate 13 that is connected to word line, a floating plate 14 that is connected to a gate of the CMOS inverter 11, a control capacitor area 15 that is formed between the control plate 13 and the floating plate 14, a tunneling plate 16, a tunneling capacitor area 17 that is formed between the floating plate 14 and the tunneling plate 16, and a transfer gate 21 that is connected to the tunneling plate 16.

The transfer gate 21 includes a p-channel metal-oxide semiconductor field effect transistor (p-MOSFET) 22 and an n-channel metal-oxide semiconductor field effect transistor (n-MOSFET) 23, and the MOSFETs may be coupled in parallel.

That is, a drain of the p-MOSFET 22 and a drain of the n-MOSFET 23 are connected, and a source of the p-MOSFET 22 and a source of the n-MOSFET 23 are connected. In this case, when a drain of each MOSFET is connected to the tunneling plate 16, a source of each MOSFET is connected to the bit line, and when a source of each MOSFET is connected to the tunneling plate 16, drains of the MOSFETs are each connected to the bit line.

Gates of each MOSFET included in the transfer gate 21 are commonly grounded. When gates of each MOSFET included in the transfer gate 21 are commonly grounded, a control circuit or an outer line for supplying power may not be added and thus the size of a cell may not be increased. Further, even if a new constituent element is added, an additional operation step is not needed according to addition of a new constituent element and thus control operation may become simple.

A thickness of a tunneling oxide film that is included in the tunneling capacitor area 17 may be smaller than 70 Å, and in this case, an operation voltage of the EEPROM cell 20 is determined according to a thickness of the tunneling oxide film. As a thickness of the tunneling oxide film decreases, a magnitude of an operation voltage of the EEPROM cell 20 also decreases.

Further, even when a capacitor capacity of the control capacitor area 15 is larger than that of the tunneling capacitor area 17, a magnitude of an operation voltage may decrease. The tunneling capacitor is inevitably formed between tunneling oxide films and may have a size of 10% or lower than that of a control capacitor. For example, when a thickness of the tunneling oxide film is 26 Å and a capacitor capacity of the control capacitor area 15 is larger by 10 times than that of the tunneling capacitor area 17, a voltage thereof may be determined to be 2 V.

Referring to FIG. 2, an added operation of the transfer gate 21 according to each operation of the EEPROM cell will be described.

When the EEPROM cell performs a programming operation and an erasing operation, the transfer gate 21 transfers a voltage that is applied to the bit line to the tunneling plate 16. That is, when the EEPROM cell 20 performs a programming operation, the applied voltage is transferred to the tunneling plate 16 through the n-MOSFET 23, and when the EEPROM cell 20 performs an erasing operation, the applied voltage is transferred to the tunneling plate 16 through the p-MOSFET 22. Finally, when the EEPROM cell 20 performs a programming operation and an erasing operation, the inserted transfer gate 21 does not have an influence on programming and erasing operations of the EEPROM cell 20.

In a standby operation of the EEPROM cell 20, because 0 V is applied to the bit line, the inserted transfer gate 21 intercepts the bit line and the tunneling plate 16. Therefore, the tunneling plate 16 is in a floating state for a standby operation of the EEPROM.

That is, the tunneling plate 16 is floated between a threshold voltage of the p-MOSFET 22 and a threshold voltage of the n-MOSFET 23 that are included in the inserted gate. For example, when a threshold voltage of the p-MOSFET 22 is −0.5 V and a threshold voltage of the n-MOSFET 23 is 0.5 V, the tunneling plate 16 is floated in a range between −0.5 V and 0.5 V (the negative number of an n-MOSFET threshold voltage-the negative number of the p-MOSFET threshold voltage).

In this case, a voltage of the floated tunneling plate 16 is influenced and changed by a voltage that is applied to the word line. When an operation voltage of the positive number is applied to the word line, a voltage of the floated tunneling plate 16 rises to a negative value of a p-MOSFET threshold voltage, and when an operation voltage of the negative number is applied to the word line, a voltage of the floated tunneling plate 16 falls to a negative value of the n-MOSFET threshold voltage.

As described above, in a standby operation of the EEPROM cell, when a voltage of the floated tunneling plate 16 changes according to an operation voltage that is applied to the word line, a voltage difference that is applied to both ends of the tunneling capacitor area 17 resultantly decreases. Accordingly, electrons moving by passing through the tunneling capacitor area 17 are reduced, and a data disturbance phenomenon is finally suppressed. That is, a voltage of the floated tunneling plate 16 moves in a direction that reduces a voltage difference from a voltage of the floating plate 14 according to a magnitude of a voltage that is applied to the word line, and thus a stable time of data that is stored at the EEPROM cell 20 may be extended.

In the foregoing description, a standby operation of the EEPROM cell is exemplified, but this is applied even to a standby operation which is an intermediate operation of a programming or erasing operation, and this is applied even to an EEPROM cell that performs an "unselected" programming or erasing operation in which a voltage of the same magnitude is applied to the bit line and the word line.

In this case, as a magnitude of a threshold voltage of MOSFETs that are included in the transfer gate 21 increases, a difference between voltages that are applied to both ends of the tunneling capacitor area 17 decreases and thus a data disturbance phenomenon may be further suppressed. As a scale of a process decreases and a thickness of a tunneling oxide film further reduces, a magnitude of a threshold voltage decreases and a change of the threshold voltage is slight, but a magnitude of an operation voltage also reduces according to the change of the threshold voltage and thus a voltage difference between both ends of the tunneling capacitor area 17 may further decrease, whereby a suppressing effect of a data disturbance phenomenon may further largely increase.

Figure 3:
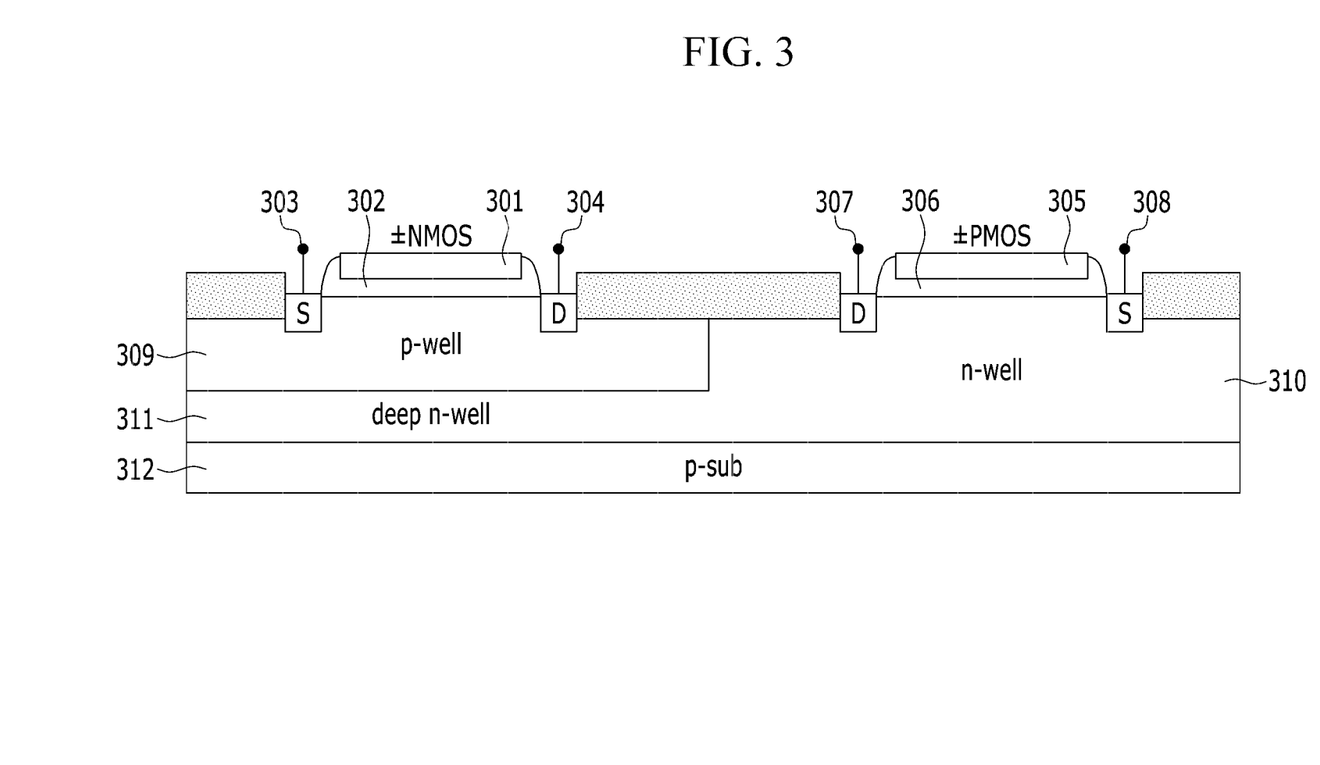
FIG. 3 is a diagram illustrating a transfer gate according to an exemplary embodiment of the present invention.

FIG. 3 is a diagram illustrating a transfer gate according to an exemplary embodiment of the present invention.

Referring to FIG. 3, the transfer gate 21 that is further included in the EEPROM cell 20 includes a p-MOSFET and an n-MOSFET. A gate 301 of the N-MOSFET and a gate 305 of a p-MOSFET are commonly grounded. Metal oxide films 302 and 306 are positioned at the lower side of a gate of each MOSFET, a drain 304 and a source 303 are positioned at both sides of the gate 301 of the n-MOSFET, and electrons are doped with a high concentration at each of the drain 304 and the source 303.

A drain 307 and a source 308 are positioned at both sides of the gate 305 of the p-MOSFET, and holes are doped with a high concentration at each of the drain 307 and the source 308.

When a P-MOSFET and an n-MOSFET of the transfer gate 21 are coupled in parallel, the drain 304 of the n-MOSFET and the drain 307 of the p-MOSFET are connected to the bit line, and the source 303 of the n-MOSFET and the source 308 of the p-MOSFET are connected to the tunneling plate 16. Alternatively, the drain 304 of the n-MOSFET and the drain 307 of the p-MOSFET may be connected to the tunneling plate 16, and the source 303 of the n-MOSFET and the source 308 of the p-MOSFET may be connected to the bit line.

The transfer gate 21 forms an n-MOSFET in a p-type substrate 312 that is doped with holes and forms an n-type well 310 that is doped with electrons of the p-type substrate 312, and may be manufactured with an n-type well process of forming a p-MOSFET.

Further, a deep n-type well 311 that separates the p-type substrate 312 of the transfer gate 21 and a p-type well 309 of an n-MOSFET that is doped with holes is formed, and as the deep n-type well 311 shields holes that are generated in the p-type substrate 312, the deep n-type well 311 may be manufactured with a triple-well process that may electrically isolate the p-type well 309. In this case, electromagnetic interference between the p-type well 309 and the p-type substrate 312 can be minimized.

A minimum value of a programming or erasing operation voltage of the EEPROM cell is fixedly applied to the p-type well 309 of the n-MOSFET, a maximum value of a programming or erasing operation voltage of the EEPROM cell is fixedly applied to the n-type well 310 of the p-MOSFET, and the deep n-type well 311 is grounded.

Figure 4:
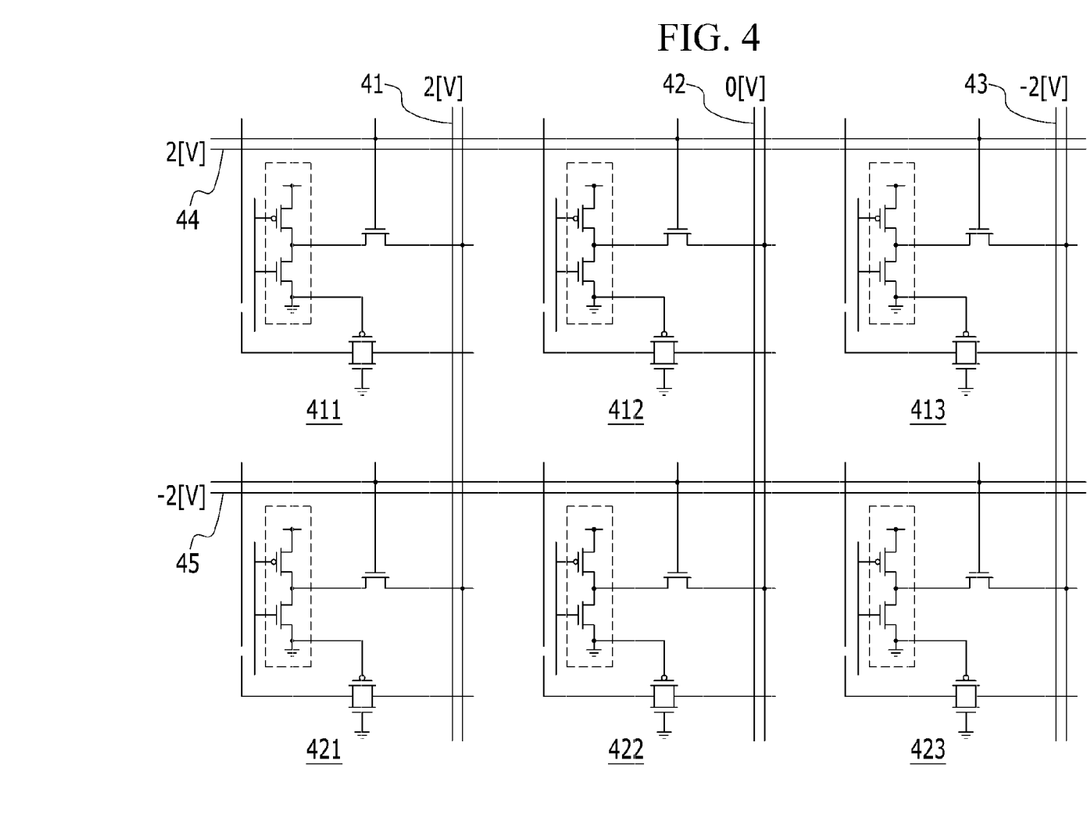
FIG. 4 is a diagram illustrating programming, erasing, and standby operations of an EEPROM cell according to an exemplary embodiment of the present invention.

FIG. 4 is a diagram illustrating programming, erasing, and standby operations of an EEPROM cell according to an exemplary embodiment of the present invention.

Referring to FIG. 4, in an exemplary embodiment according to the present invention, in programming, erasing, and standby operations of the EEPROM cell, 2 V (41), 0 V (42), and −2 V (43) are each applied to the bit line, and 2 V (44) and −2 V (45) are each applied to the word line.

Further, for programming, erasing, and standby operations, in a sensor gate line, a voltage of 0 V is sustained, and a sensor line is connected to high impedance and thus a current does not flow. In FIG. 4, both the sensor gate line and the sensor line are represented by a dotted line.

Magnitudes of voltages that are applied to the word line, the bit line, a sensor gate line, and a sensor line were provided in Table 1 according to each operation of the EEPROM cell.

TABLE 1

| | | Operation condition of EPROM cell | | | |
| --- | --- | --- | --- | --- | --- |
| | | Operation | | | |
| | Line | Standby | Erasing | Programming | Sense |
| Selected cell | Word line | −2~2 V | −2 V | 2 V | 0.24 V |
| | Bit line | 0 V | 2 V | −2 V | 0 V |
| | Sense | 0 V | 0 V | 0 V | 2 V |

TABLE 1-continued

Operation condition of EPROM cell

|  | Line | Operation | | | |
|---|---|---|---|---|---|
|  |  | Standby | Erasing | Programming | Sense |
| Unselected cell | gate line |  |  |  |  |
|  | Sense line | High Z | High Z | High Z | DATA |
|  | Word line | −2~2 V | 2 V | −2 V | 0.24 V |
|  | Bit line | 0 V | 2 V | −2 V | 0 V |
|  | Sense gate line | 0 V | 0 V | 0 V | 0 V |
|  | Sense line | High Z | High Z | High Z | High Z |

In EEPROM cells that are shown in FIG. 4, two cells that are positioned at column 1 to which 2 V is applied to the bit line will be first described.

As 2 V is applied to both the bit line and the word line, an EEPROM cell 411 of column 1 and row 1 becomes an unselected "erasing operation cell". In this case, a voltage difference generally occurs by charges that are stored at the floating plate 14. For example, when it is determined that a voltage of 0.8 V is applied to the tunneling capacitor area 17, in this state, data that are stored at a cell may be sustained for 100 years or more.

As 2 V is applied to the bit line and −2 V is applied to the word line, an EEPROM cell 421 of row 2 and column 1 becomes a selected "erasing operation cell". In this case, as −2 V that is applied to the word line is transferred to the floating plate 14 through the control plate 13, −2 V becomes a voltage of the floating plate 14, and as 2 V that is applied to the bit line is transferred to the tunneling plate 16, 2 V becomes a voltage of the tunneling plate 16.

In consideration of several variables such as an influence of charges that are stored at the floating plate 14, a voltage that is applied to both ends of the tunneling capacitor area 17 may be somewhat different from −4 V, but it does not have a large influence on extraction of charges from the tunneling capacitor area 17. In an erasing operation, about 3 ms may be consumed.

Hereinafter, two cells that are positioned at column 3 in which −2 V is applied to the bit line will be described.

As −2 V is applied to the bit line and 2 V is applied to the word line, an EEPROM cell 413 of row 1 and column 3 becomes a selected "programming operation cell". In this case, 2 V that is applied to the word line is transferred to the floating plate 14 through the control plate 13 and becomes a voltage of the floating plate 14, and 2 V that is applied to the bit line is transferred to the tunneling plate 16 and becomes a voltage of the tunneling plate 16.

In this case, a voltage that is applied to both ends of the tunneling capacitor area 17 may be somewhat different from 4 V, but has no large influence on operation of injecting charges to the tunneling capacitor area 17. In a programming operation, about 3 ms may be consumed.

As −2 V is applied to both the bit line and the word line, an EEPROM cell 423 of row 2 and column 3 becomes an unselected "programming operation cell". Even in this case, a voltage difference generally occurs by charges that are stored at the floating plate 14. For example, when it is determined that a voltage of 1.1 V is applied to the tunneling capacitor area 17, in this state, data that are stored at the cell may be sustained for 100 years or more.

Finally, two cells that are positioned at column 2 in which 0 V is applied to the bit line will be described.

When 0 V is applied to the bit line and −2 V or 2 V is applied to the word line, all cells that are positioned at column 2 become "standby operation cells". In this case, in EEPROM cells 412 and 422, as a voltage margin of the tunneling plate 16 increases by an influence of the transfer gate 21, a voltage difference between the tunneling plate 16 and the floating plate 14 decreases.

For example, in the already-erased cell 412, when a 0.5 V decrease from 2.7 V to 2.2 V occurs, in a standby operation, a stable time of data may be improved from about 63 seconds ($2 \times 10^{-6}$ years) to about 10 days ($3 \times 10^{-2}$ years).

Further, in the already-programmed cell 422, when a 0.5 V decrease occurs by a voltage margin that increases from −2.0 V to −1.5 V, in a standby operation, a stable time of data may be improved from about 6300 seconds ($2 \times 10^{-4}$ years) to about 10 years.

Figure 5:
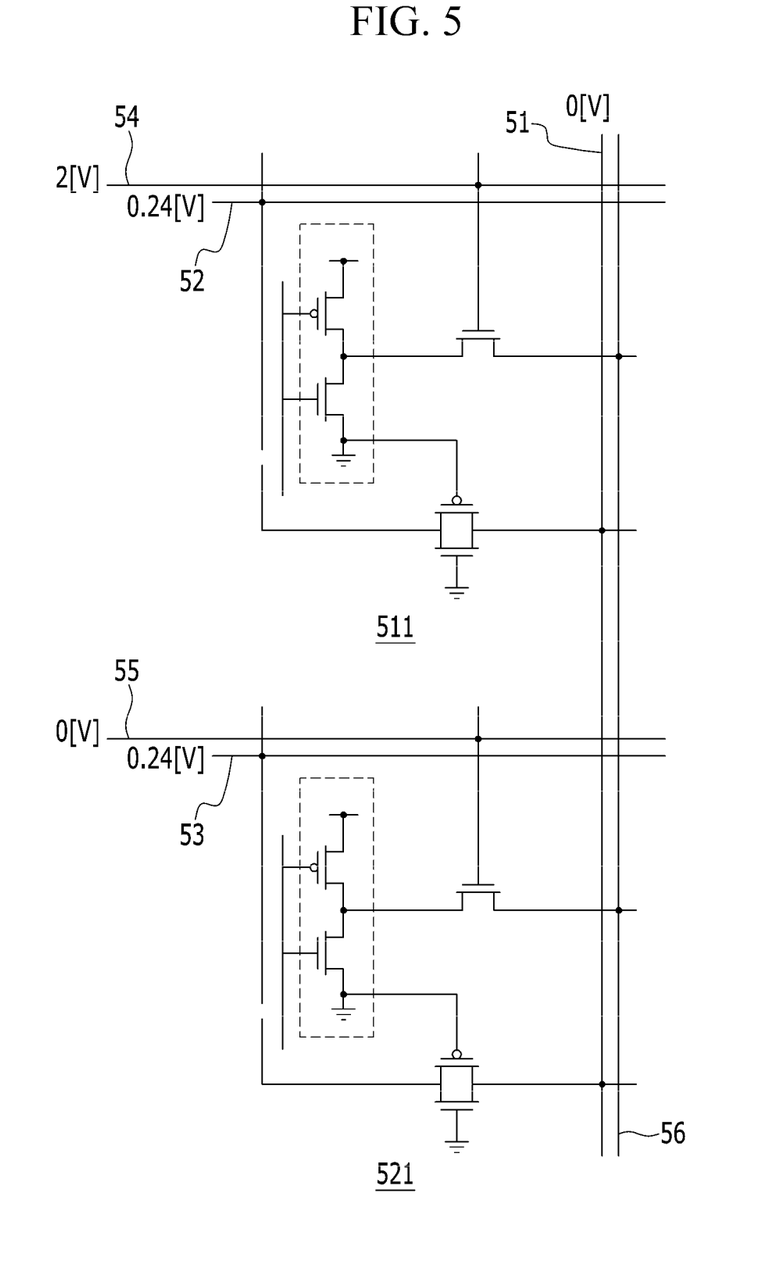
FIG. 5 is a diagram illustrating a sense operation of an EEPROM cell according to an exemplary embodiment of the present invention.

FIG. 5 is a diagram illustrating a sense operation of an EEPROM cell according to an exemplary embodiment of the present invention.

Referring to FIG. 5, for a sense operation of the EEPROM cell, 0 V is applied to a bit line 51, and 0.24 V is applied to word lines 52 and 53. When it is assumed that a logical threshold voltage of the CMOS inverter 11 is 0.56 V, 0.24 V is applied to the word lines 52 and 53 and this enables a central point of a potential that is generated by charges that are stored at the floating plate 14 to pass through the logical threshold voltage and may be selected as an appropriate value. In order to not form an unnecessary voltage difference in the tunneling capacitor area 17, 0 V may be applied to the bit line 51.

Thereafter, when 2 V is applied to a sensor gate line 54 parallel to the word line, the data output MOSFET 12 operates, and an output voltage of the CMOS inverter 11 is sensed in a sensor line 56. In an EEPROM cell in which 0 V is applied to a sensor gate line 55, because the data output MOSFET 12 does not operate, data that is stored at the EEPROM cell cannot be read. As can be seen in Table 1, in this case, the sensor line 56 is connected to high impedance and cannot sense a voltage.

In an EEPROM cell according to an exemplary embodiment of the present invention, because an EEPROM cell in which a programming operation is performed holds many negative charges at the floating plate 14, despite a voltage (e.g., 0.24 V) that is applied to the word line, the EEPROM cell does not operate the CMOS inverter 11 and thus cannot output a voltage (e.g., 1.2 V) that is stored at the CMOS inverter 11. That is, the sensor line 56 cannot read a voltage that is stored at the CMOS inverter 11.

However, because an EEPROM cell in which an erasing operation is performed holds many positive charges at the floating plate 14, by applying the CMOS inverter 11, the EEPROM cell outputs a voltage that is stored at the CMOS inverter 11. That is, as the sensor line 56 senses a voltage that is stored at the CMOS inverter 11, the sensor line 56 reads data.

In this way, according to an exemplary embodiment of the present invention, as a transfer gate is added between a bit line and a tunneling plate of an EEPROM cell, in a standby operation of the EEPROM cell, the tunneling plate may be floated, and accordingly, in a standby operation of the EEPROM cell, a voltage of a floated floating plate moves in a direction that reduces a voltage difference from a voltage of the floating plate according to a magnitude of a voltage that is applied to a word line and thus a stable time of data that is stored at the EEPROM cell can be extended.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An EEPROM cell, comprising:
   an inverter;
   a tunneling plate;
   a data output metal oxide semiconductor field effect transistor (MOSFET) that is connected to the inverter;
   a floating plate that is connected to the inverter;
   a tunneling capacitor area that is formed between the floating plate and the tunneling plate; and
   a transfer gate that is connected to the tunneling plate,
   wherein the transfer gate transfers an operation voltage of the EEPROM cell that is applied to a bit line of the EEPROM cell to the tunneling plate.

2. The EEPROM cell of claim 1, wherein the inverter is a CMOS inverter, and a gate of the CMOS inverter is connected to the floating plate.

3. The EEPROM cell of claim 1, further comprising:
   a control plate that is connected to a word line of the EEPROM cell; and
   a control capacitor area that is formed between the control plate and the floating plate.

4. The EEPROM cell of claim 3, wherein a capacity of a capacitor that is formed in the tunneling capacitor area is 1%-10% of that of a capacitor that is formed in the control capacitor area.

5. The EEPROM cell of claim 1, wherein the transfer gate comprises a p-MOSFET and an n-MOSFET, and
   a drain of the p-MOSFET and a drain of the n-MOSFET are connected to the tunneling plate, while a source of the p-MOSFET and a source of the n-MOSFET are connected to a bit line.

6. The EEPROM cell of claim 1, wherein the transfer gate comprises a p-MOSFET and an n-MOSFET, and
   a source of the p-MOSFET and a source of the n-MOSFET are connected to the tunneling plate, while a drain of the p-MOSFET and a drain of the n-MOSFET are connected to a bit line.

7. The EEPROM cell of claim 5, wherein the transfer gate comprises:
   an n-type well that is doped with donor;
   a p-type well that is doped with acceptor; and
   a deep n-type well that separates the p-type well from a p-type substrate of the transfer gate.

8. The EEPROM cell of claim 7, wherein a maximum value of a programming or erasing operation voltage of the EEPROM cell is applied to the n-type well of the transfer gate, a minimum value of a programming or erasing operation voltage of the EEPROM cell is applied to the p-type well, and the deep n-type well is grounded.

9. The EEPROM cell of claim 5, wherein a gate of the p-MOSFET and a gate of the n-MOSFET are commonly grounded.

10. A method of suppressing a data disturbance phenomenon of an EEPROM cell comprising an inverter, a tunneling plate, a data output MOSFET that is connected to the inverter, a floating plate that is connected to the inverter, a tunneling capacitor area that is formed between the floating plate and the tunneling plate, and a transfer gate that is connected to the tunneling plate, the method comprising:
    intercepting a voltage that is transferred to the tunneling plate by the transfer gate;
    floating a voltage of the tunneling plate within a predetermined voltage range; and
    increasing or decreasing the voltage of the floated tunneling plate according to a voltage of the floating plate in order to reduce a difference between the voltage of the floated tunneling plate and a voltage of the floating plate.

11. The method of claim 10, wherein the intercepting a voltage that is transferred to the tunneling plate by the transfer gate if the EEPROM cell is in standby mode, sense mode or unselected mode.

* * * * *